(12) United States Patent
Nagase et al.

(10) Patent No.: US 9,165,927 B2
(45) Date of Patent: Oct. 20, 2015

(54) SEMICONDUCTOR DEVICE

(71) Applicants: JTEKT CORPORATION, Osaka-shi, Osaka (JP); DENSO CORPORATION, Kariya-shi, Aichi-ken (JP)

(72) Inventors: Shigeki Nagase, Nabari (JP); Kazuo Tada, Anjo (JP)

(73) Assignees: JTEKT Corporation, Osaka (JP); Denso Corporation, Kariya (JP)

( * ) Notice: Subject to any disclaimer, the term of this patent is extended or adjusted under 35 U.S.C. 154(b) by 0 days.

(21) Appl. No.: 14/323,382

(22) Filed: Jul. 3, 2014

(65) Prior Publication Data

US 2015/0008534 A1    Jan. 8, 2015

(30) Foreign Application Priority Data

Jul. 4, 2013   (JP) ................. 2013-140748

(51) Int. Cl.
| | | |
|---|---|---|
| *H01L 27/088* | (2006.01) | |
| *H01L 23/48* | (2006.01) | |
| *H05K 1/18* | (2006.01) | |
| *H01L 23/538* | (2006.01) | |
| *H01L 25/07* | (2006.01) | |

(52) U.S. Cl.
CPC .......... *H01L 27/088* (2013.01); *H01L 23/5389* (2013.01); *H01L 25/074* (2013.01)

(58) Field of Classification Search
CPC .. H01L 27/088; H01L 25/074; H01L 23/5389
USPC ............... 257/326, 347, 350, 389, 401, 690, 257/E25.015, E25.021, E23.044, E23.142, 257/E21.614, E21.703; 438/152, 455, 612
See application file for complete search history.

(56) References Cited

U.S. PATENT DOCUMENTS

| | | | |
|---|---|---|---|
| 6,882,010 B2 * | 4/2005 | Bhattacharyya | ............... 257/350 |
| 8,227,906 B2 * | 7/2012 | Sasaki et al. | .................. 257/686 |
| 2007/0284720 A1 * | 12/2007 | Otremba et al. | .............. 257/690 |
| 2008/0115349 A1 | 5/2008 | Kim et al. | |
| 2013/0010446 A1 * | 1/2013 | Henrik et al. | ................. 361/783 |
| 2014/0312360 A1 * | 10/2014 | Otremba et al. | ................ 257/77 |

FOREIGN PATENT DOCUMENTS

| | | |
|---|---|---|
| JP | 2004-153084 A | 5/2004 |
| JP | A-2012-9602 | 1/2012 |
| JP | A-2012-80030 | 4/2012 |

* cited by examiner

*Primary Examiner* — Dao H Nguyen
(74) *Attorney, Agent, or Firm* — Oliff PLC

(57) ABSTRACT

In a semiconductor device, each of a first connection metal member, a second connection metal member, a third connection metal member, and a fourth connection metal member electrically connects a corresponding line to a corresponding one of main electrodes formed on lower surfaces and upper surfaces of first and second semiconductor elements. A cross-sectional area of each of the first connection metal member, the second connection metal member, the third connection metal member, and the fourth connection metal member is larger than a cross-sectional area of a fifth connection metal member that is disposed at a region located outside regions of the first and second semiconductor elements in a plan view.

6 Claims, 4 Drawing Sheets

SEMICONDUCTOR DEVICE

INCORPORATION BY REFERENCE

The disclosure of Japanese Patent Application No. 2013-140748 filed on Jul. 4, 2013 including the specification, drawings and abstract is incorporated herein by reference in its entirety.

BACKGROUND OF THE INVENTION

1. Field of the Invention

The present invention relates to a semiconductor device such as a power module.

2. Description of Related Art

A power module is a device in which paired switching elements are connected in series to a power supply, and an output is obtained from between the paired switching elements. Such a power module is used in, for example, an inverter circuit constituting a driving circuit for driving an electric motor.

The inventors have developed a new method of manufacturing a power module. Specifically, a plurality of sheet members, on which predetermined processing is performed in advance, are prepared. Each of the sheet members includes a thermoplastic resin film. The predetermined processing includes etching for forming a circuit, hole processing for forming a hole, and metal paste filling for forming a connection metal member such as a via. A component hole for receiving an electronic component is formed in a predetermined sheet member.

The plurality of sheet members are stacked. In this process, each of a high-side switching element and a low-side switching clement is received in a predetermined component hole. These two switching elements are disposed to face each other at intervals in atop-bottom direction. Hot pressing is performed in a state where all the sheet members are stacked. Thus, it is possible to obtain a power module in which the high-side switching element and the low-side switching element are provided.

In such a power module, a connection metal member, which is electrically connected to a main electrode formed on the upper surface side of each of the switching elements, is disposed on the upper surface of the switching element. In addition, a connection metal member, which is electrically connected to a main electrode formed on the lower surface side of each of the switching elements, is disposed on the lower surface of the switching element. In such a power module, when a plurality of sheet members stacked in a manufacturing process are hot-pressed together, large stress is applied to each of the switching elements through the connection metal members, and therefore, there is a possibility that breakage may occur in the switching element.

SUMMARY OF THE INVENTION

The invention provides a semiconductor device having a structure which suppresses or prevents occurrence of breakage in a semiconductor element in a manufacturing process.

A first aspect of the invention relates to a semiconductor device including a first line layer having a first line; a first interlayer film formed on the first line layer, a second line layer that is formed on the first interlayer film, and that has a second line; a first semiconductor element provided inside the first interlayer film; a second interlayer film formed on the second line layer; a second semiconductor element that is provided inside the second interlayer film, and that is disposed to face the first semiconductor element; a third line layer that is formed on the second interlayer film, and that has a third line; a first connection metal member that electrically connects the first line to a main electrode formed on a lower surface of the first semiconductor element, a second connection metal member that electrically connects the second line to a main electrode formed on an upper surface of the first semiconductor element; a third connection metal member that electrically connects the second line to a main electrode formed on a lower surface of the second semiconductor element; a fourth connection metal member that electrically connects the third line to a main electrode formed on an upper surface of the second semiconductor element; and a fifth connection metal member that is disposed at a region located outside regions of the first and second semiconductor elements in a plan view, the fifth connection metal member connecting the first line to the second line or connecting the second line to the third line, wherein a cross-sectional area of each of the first connection metal member, the second connection metal member, the third connection metal member and the fourth connection metal member is larger than a cross-sectional area of the fifth connection metal member.

In the above aspect of the invention, the connection metal member, which has a cross-sectional area larger than that of the connection metal member disposed at a region located outside the regions of the first and second semiconductor elements, is disposed on each of the upper side and lower side of each of the semiconductor elements. Therefore, when the semiconductor device is manufactured by stacking a plurality of sheet members on which predetermined processing is performed in advance, in a manner such that the first and second semiconductor elements are provided inside the sheet members, and hot-pressing the sheet members together, it is possible to reduce stress applied to each of the semiconductor elements. Thus, it is possible to suppress or prevent occurrence of breakage in each of the semiconductor elements in a manufacturing process.

A second aspect of the invention relates to a semiconductor device including a first line layer having a first line; a first interlayer film formed on the first line layer; a second line layer that is formed on the first interlayer film, and that has a second line; a first semiconductor element provided inside the first interlayer film; a second interlayer film formed on the second line layer; a second semiconductor element that is provided inside the second interlayer film, and that is disposed to face the first semiconductor element; a third line layer that is formed on the second interlayer film, and that has a third line; a first connection metal member that electrically connects the first line to a main electrode formed on a lower surface of the first semiconductor element; a second connection metal member that electrically connects the second line to a main electrode formed on an upper surface of the first semiconductor element; a third connection metal member that electrically connects the second line to a main electrode formed on a lower surface of the second semiconductor element; and a fourth connection metal member that electrically connects the third line to a main electrode formed on an upper surface of the second semiconductor element, wherein a contact area of the first connection metal member, which contacts the main electrode, is equal to or larger than 50% of an area of the lower surface of the first semiconductor element, a contact area of the second connection metal member, which contacts the main electrode, is equal to or larger than 50% of an area of the upper surface of the first semiconductor element, a contact area of the third connection metal member, which contacts the main electrode, is equal to or larger than 50% of an area of the lower surface of the second semiconductor element, and a contact area of the fourth connection metal member, which contacts the main electrode, is equal to or larger than 50% of an area of the upper surface of the second semiconductor element.

In the above aspect of the invention, the contact area of each of the connection metal members is equal to or larger than 50% of the corresponding surface of the corresponding semiconductor element, the connection metal members being connected to the respective main electrodes on the lower surfaces and the upper surfaces of the semiconductor elements, and the contact area of each of the connection metal members contacting the corresponding main electrode. Therefore, when the semiconductor device is manufactured by stacking a plurality of sheet members on which predetermined processing is performed in advance, in a manner such that the first and second semiconductor elements are provided inside the sheet members, and hot-pressing the sheet members together, it is possible to reduce stress applied to each of the semiconductor elements. Thus, it is possible to suppress or prevent occurrence of breakage in each of the semiconductor elements in a manufacturing process.

In each of the above aspects of the invention, the semiconductor device is manufactured by stacking a plurality of sheet members on which predetermined processing is performed in advance, in a manner such that the first and second semiconductor elements are provided inside the sheet members, and hot-pressing the sheet members together.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
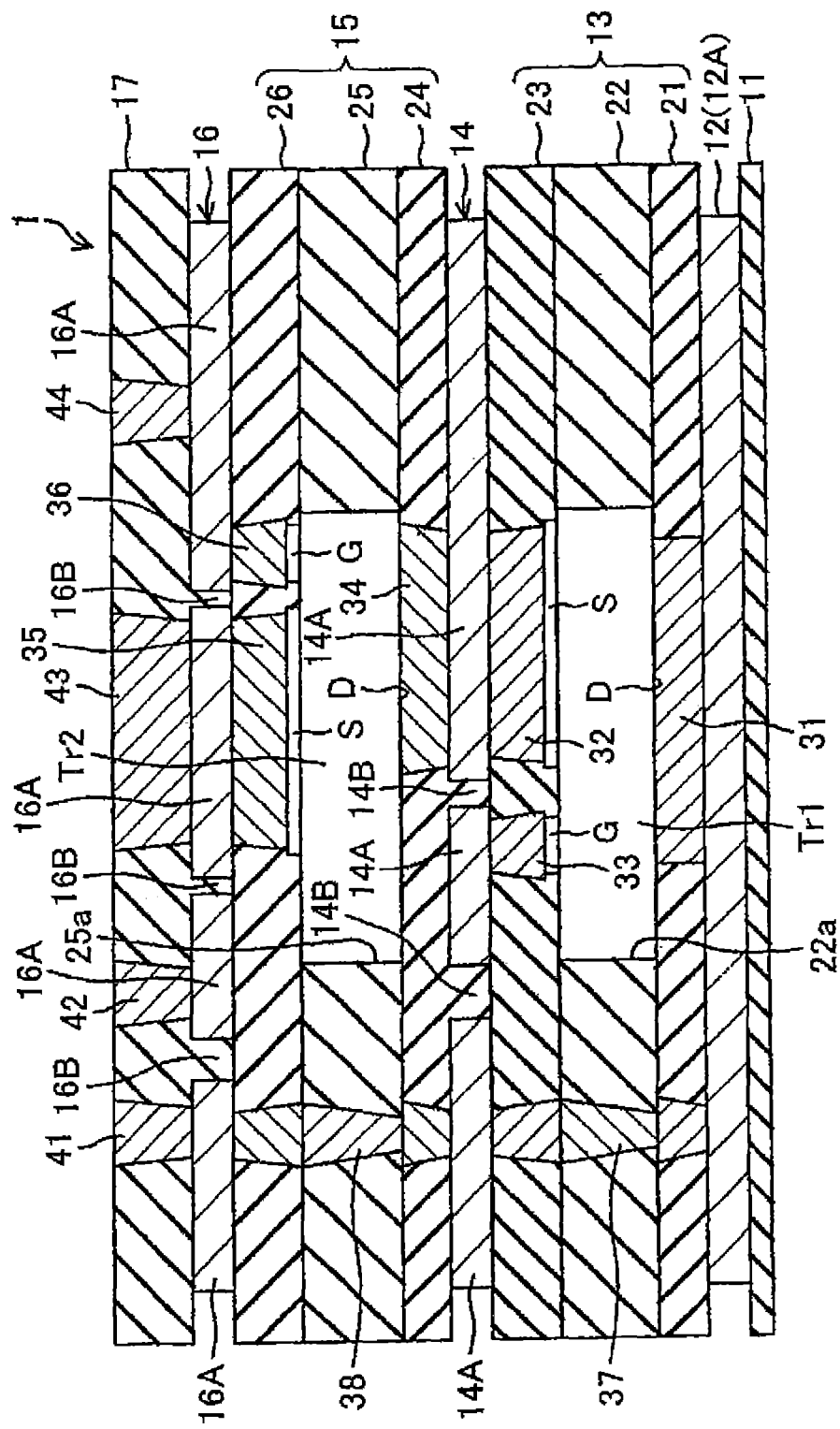
FIG. 1 is a cross-sectional view illustrating a configuration of a power module according to an embodiment of the invention.
Figure 2:
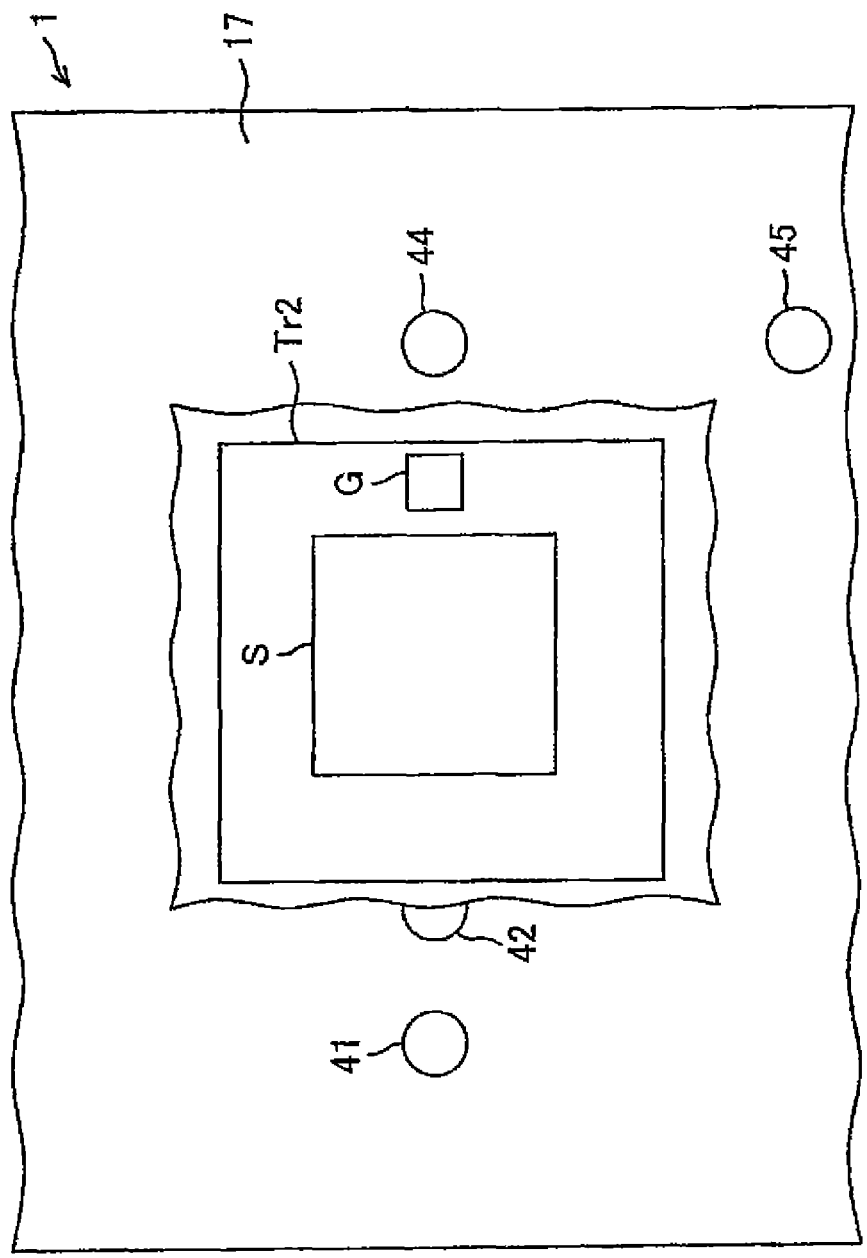
FIG. 2 is a partially cut plan view of FIG. 1.

Hereinafter, an embodiment in which the invention is applied to a power module will be described with reference to the accompanying drawings. FIG. 1 is a cross-sectional view illustrating a configuration of a power module according to an embodiment of the invention. FIG. 2 is a partially cut plan view of FIG. 1. A power module 1 is formed to have a substantially square shape in a plan view. The power module 1 includes a first switching element Tr1 and a second switching element Tr2 which are disposed to face each other at intervals in a top-bottom direction.

Each of the switching elements Tr1, Tr2 is quadrangular in the plan view. In this embodiment, each of the switching elements Tr1, Tr2 is constituted by an N-channel type Metal Oxide Semiconductor Field Effect Transistor (MOSFET). Each of the switching elements Tr1, Tr2 has a drain electrode D disposed on the lower surface thereof. Each of the switching elements Tr1, Tr2 has a source electrode S and a gate electrode G disposed on the upper surface thereof. In this specification, the drain electrode and the source electrode are collectively called main electrodes, and the gate electrode is called a control electrode.

A first line layer 12 having a first line 12A is formed on a lower insulating film 11. A first interlayer film 13 is formed on the first line layer 12. A second line layer 14 having second lines 14A is formed on the first interlayer film 13. An insulating resin 14B is filled into a gap between the second lines 14A. A second interlayer film 15 is formed on the second line layer 14. A third line layer 16 having third lines 16A is formed on the second interlayer film 15. An insulating resin 16B is filled into a gap between the third lines 16A. An upper insulating film 17 is formed on the third line layer 16.

The first interlayer film 13 has a structure in which a first insulating film 21, a second insulating film 22 and a third insulating film 23 are stacked in order from the first line layer 12 side. The second interlayer film 15 has a structure in which a fourth insulating film 24, a fifth insulating film 25 and a sixth insulating film 26 are stacked in order from the second line layer 14 side. In this embodiment, each of the lower insulating film 11, the first insulating film 21, the second insulating film 22, the third insulating film 23, the fourth insulating film 24, the fifth insulating film 25, the sixth insulating film 26 and the upper insulating film 17 is formed of an insulating thermoplastic resin. Each of the first line 12A, the second line 14A and the third line 16A is formed of copper.

The first switching element Tr1 is provided inside the first interlayer film 13. Specifically, the second insulating film 22 within the first interlayer film 13 has a component hole 22a extending through the second insulating film 22, and the first switching element Tr1 is disposed in the component hole 22a. The second switching element Tr2 is disposed at a position directly above the first switching element Tr1. Specifically, the second switching element Tr2 is provided inside the second interlayer film 15. More specifically, the fifth insulating film 25 within the second interlayer film 15 has a component hole 25a extending through the fifth insulating film 25, and the second switching element Tr2 is disposed in the component hole 25a.

The drain electrode D of the first switching element Tr1 and the first line 12A are electrically connected to each other by a first via 31 extending through the first insulating film 21. The first via 31 is disposed within a region in which the first switching element Tr1 is disposed, in the plan view. The first via 31 is substantially rectangular in the plan view. The contact area of the first via 31, which contacts the drain electrode D of the first switching element Tr1, is equal to or larger than 50% of the area of the lower surface of the first switching element Tr1.

The source electrode S of the first switching element Tr1 and the second line 14A are electrically connected to each other by a second via 32 extending through the third insulating film 23. The second via 32 is disposed within the region in which the first switching element Tr1 is disposed, in the plan view. The second via 32 is substantially rectangular in the plan view. The contact area of the second via 32, which contacts the source electrode S of the first switching element Tr1, is equal to or larger than 50% of the area of the upper surface of the first switching element Tr1.

The gate electrode G of the first switching element Tr1 and the second line 14A are electrically connected to each other by a third via 33 extending through the third insulating film 23. The third via 33 is disposed within the region in which the first switching element Tr1 is disposed, in the plan view. The third via 33 has a circular truncated cone shape, and is circular in the plan view. The second line 14A, to which the source electrode S of the first switching element Tr1 is connected, and the drain electrode D of the second switching element Tr2 are electrically connected to each other by a fourth via 34 extending through the fourth insulating film 24. Thus, the source electrode S of the first switching element Tr1 and the drain electrode D of the second switching element Tr2 are electrically connected to each other. The fourth via 34 is disposed within a region in which the second switching element Tr2 is disposed, in the plan view. The fourth via 34 is substantially rectangular in the plan view. The contact area of the fourth via 34, which contacts the drain electrode D of the second switching element Tr2, is equal to or larger than 50% of the area of the lower surface of the second switching element Tr2.

The source electrode S of the second switching element Tr2 and the third line 16A are electrically connected to each other by a fifth via 35 extending through the sixth insulating film 26. The fifth via 35 is disposed within the region in which the second switching element Tr2 is disposed, in the plan view. The fifth via 35 is substantially rectangular in the plan view. The contact area of the fifth via 35, which contacts the source electrode S of the second switching element Tr2, is equal to or larger than 50% of the area of the upper surface of the second switching element Tr2.

The gate electrode G of the second switching element Tr2 and the third line 16A are electrically connected to each other by a sixth via 36 extending through the sixth insulating film 26. The sixth via 36 is disposed within the region in which the second switching element Tr2 is disposed, in the plan view. The sixth via 36 has a circular truncated cone shape, and is circular in the plan view. The first line 12A and the second line 14A are electrically connected to each other by a seventh via 37 extending through the first interlayer film 13. The seventh via 37 is disposed in a region located outside the region in which the first switching element Tr1 is disposed, in the plan view. The seventh via 37 is constituted by three portions that extend through the first insulating film 21, the second insulating film 22 and the third insulating film 23, respectively. Each of the three portions constituting the seventh via 37 has a circular truncated cone shape, and is circular in the plan view.

The second line 14A and the third line 16A are electrically connected to each other by an eighth via 38 extending through the second interlayer film 15. The eighth via 38 is disposed in a region located outside the region in which the second switching element Tr2 is disposed, in the plan view. The eighth via 38 is constituted by three portions that extend through the fourth insulating film 24, the fifth insulating film 25 and the sixth insulating film 26, respectively. Each of the three portions constituting the eighth via 38 has a circular truncated cone shape, and is circular in the plan view. Each of the vias 31 to 38 is formed using, for example, Sn—Ag.

A plurality of terminals are provided in the upper insulating film 17. Each of the terminals extends through the upper insulating film 17. These terminals include a first power supply terminal 41, a first gate terminal 42, a second power supply terminal 43, a second gate terminal 44 and an output terminal 45 (see FIG. 2). Each of the electrodes 41 to 45 is formed using, for example, Sn—Ag. The drain electrode D of the first switching element Tr1 is connected to the first power supply terminal 41 through the first via 31, the first line 12A, the seventh via 37, the second line 14A, the eighth via 38 and the third line 16A. The source electrode S of the first switching element Tr1 is connected to the drain electrode D of the second switching element Tr2 through the second via 32, the second line 14A and the fourth via 34.

The gate electrode G of the first switching element Tr1 is connected to the third line 16A to which the first gate terminal 42 is connected, through the third via 33, the second line 14A and a via (not shown) extending though the second interlayer film 15. That is, the gate electrode G of the first switching element Tr1 is connected to the first gate terminal 42. The source electrode S of the second switching element Tr2 is connected to the second power supply terminal 43 through the fifth via 35 and the third line 16A. The gate electrode G of the second switching element Tr2 is connected to the second gate terminal 44 through the sixth via 36 and the third line 16A.

The second line 14A, to which the source electrode S of the first switching element Tr1 and the drain electrode D of the second switching element Tr2 are connected, is connected to the third line 16A (not shown) through a via (not shown) extending through the second interlayer film 15. The third line 16A is connected to the output terminal 45.

That is, the source electrode S of the first switching element Tr1 and the drain electrode D of the second switching element Tr2 are connected to the output terminal 45.

Figure 3:
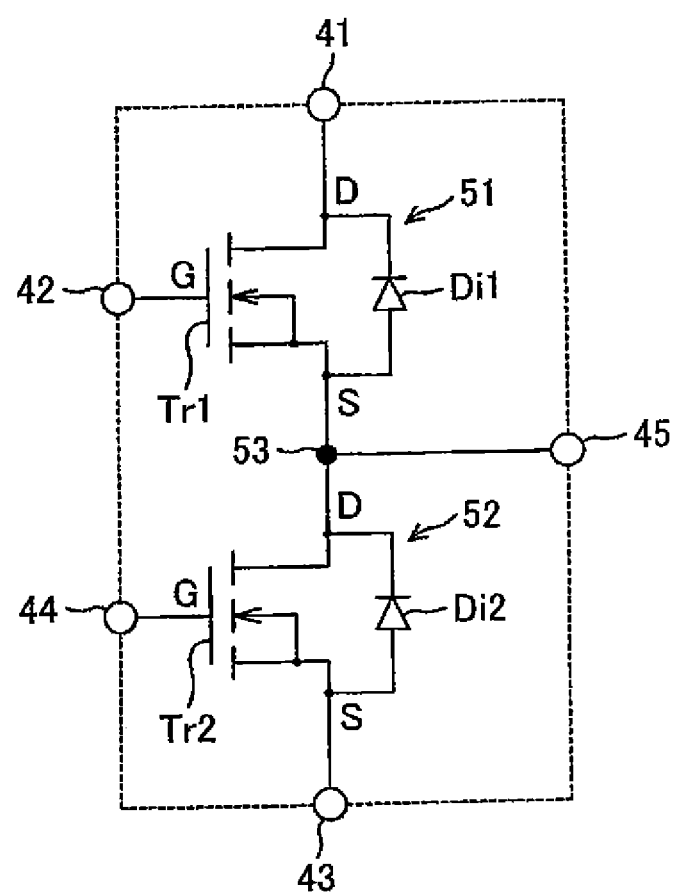
FIG. 3 is an electrical circuit diagram illustrating an electrical configuration of the power module.

The cross-sectional area of each of the first via 31, the second via 32, the fourth via 34 and the fifth via 35 is larger than any of the cross-sectional areas of the seventh via 37 and the eighth via 38. FIG. 3 is an electrical circuit diagram illustrating an electrical configuration of the power module 1. A first diode Di1 and a second diode Di2 are provided in the first switching element Tr1 and the second switching element Tr2, respectively. These diodes Di1, Di2 are called parasitic diodes or body diodes.

The first switching element Tr1 and the first diode Di1 form a high-side circuit 51. The second switching element Tr2 and the second diode Di2 form a low-side circuit 52. The high-side circuit 51 and the low-side circuit 52 are connected in series between the first power supply terminal (positive-side power supply terminal) 41 and the second power supply terminal (negative-side power supply terminal) 43, and the output terminal 45 is connected to a connecting point 53 between the high-side circuit 51 and the low-side circuit 52.

The first diode Di1 is connected in parallel to the first switching element Tr1. Specifically, the anode of the first diode Di1 is connected to the source S of the first switching element Tr1, and the cathode of the first diode Di1 is connected to the drain D of the first switching element Tr1. The second diode Di2 is connected in parallel to the second switching element Tr2. Specifically, the anode of the second diode Di2 is connected to the source S of the second switching element Tr2, and the cathode of the second diode Di2 is connected to the drain D of the second switching element Tr2.

The drain D of the first switching element Tr1 is connected to the first power supply terminal 41. The source S of the first switching element Tr1 is connected to the drain D of the second switching element Tr2. The source S of the second switching element Tr2 is connected to the second power supply terminal 43. The connecting point 53 between the source S of the first switching element Tr1 and the drain D of the second switching element Tr2 is connected to the output terminal 45. The gate G of the first switching element Tr1 is connected to the first gate terminal 42. The gate G of the second switching element Tr2 is connected to the second gate terminal 44.

Figure 4:
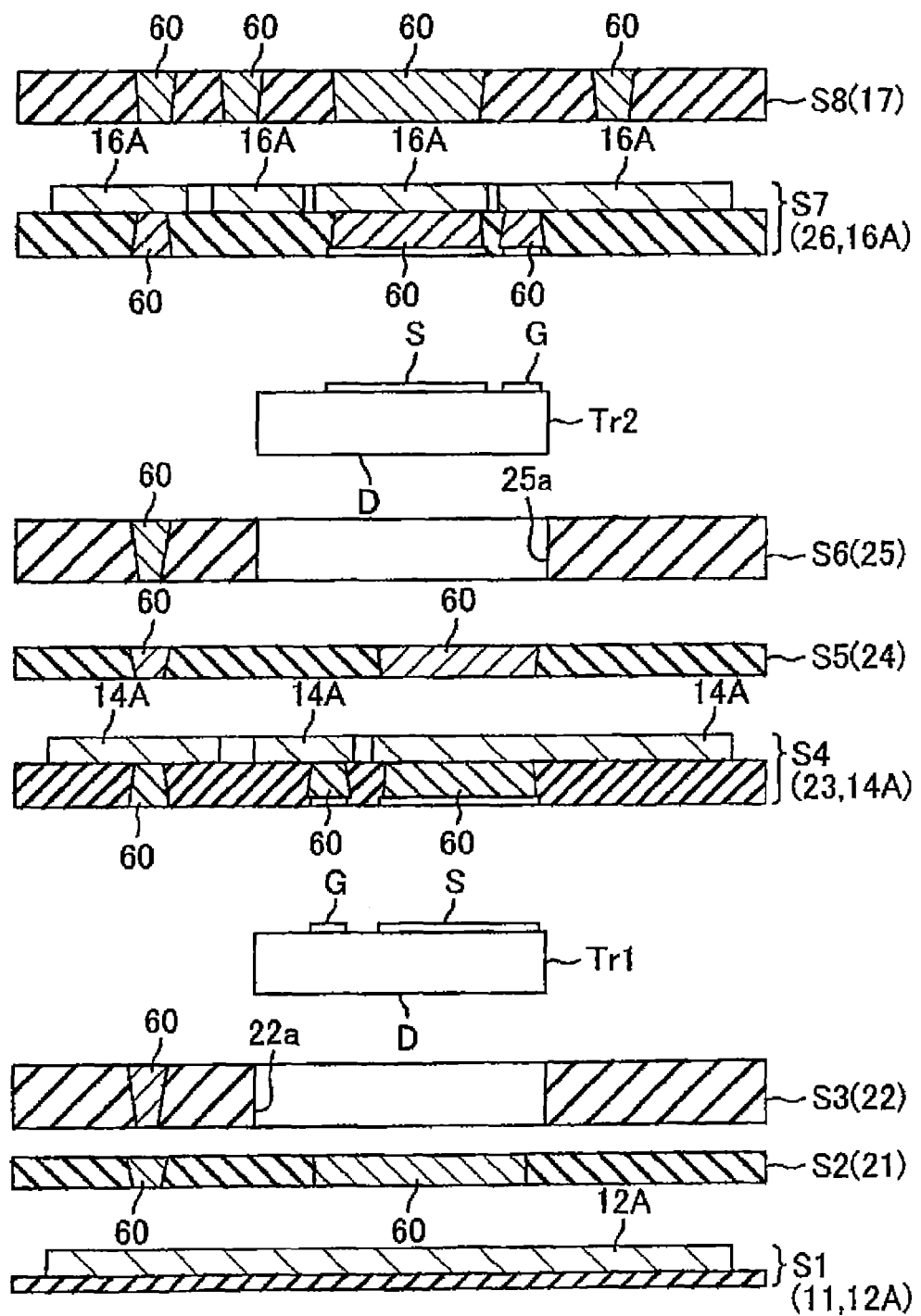
FIG. 4 is a diagram illustrating a method of manufacturing the power module.

FIG. 4 is a diagram illustrating a method of manufacturing the power module 1. First, as shown in FIG. 4, a plurality of sheet members S1 to S8 (first sheet member S1 to eighth sheet member S8), on which predetermined processing is performed, are prepared in advance. Each of the sheet members S1 to S8 is produced as follows.

The first sheet member S1 is produced for forming the lower insulating film 11 and the first line 12A. In the first sheet member S1, a thermoplastic resin film having copper foil bonded to one side thereof is used as a base material. The first line 12A is formed on the plastic resin film serving as the lower insulating film 11, by etching the copper foil of the base material. Thus, the first sheet member S1 is produced.

The second sheet member S2 is produced for forming the first insulating film 21. In the second sheet member S2, a plastic resin film is used as a base material. A plurality of via holes including via holes for respectively forming the first via 31 and a portion of the seventh via 37 are formed in this base material. A metal paste 60 made of Sn—Ag is filled into each of the via holes. Thus, the second sheet member S2 is produced.

The third sheet member S3 is produced for forming the second insulating film 22. In the third sheet member S3, a plastic resin film is used as a base material. The component hole 22a for receiving the first switching element Tr1 is formed in this base material. At least one via hole including a via hole for forming a portion of the seventh via 37 is formed in this base material. The metal paste 60 is filled into each of the via holes. Thus, the third sheet member 83 is produced.

The fourth sheet member S4 is produced for forming the third insulating film 23 and the second line 14A. In the fourth sheet member 54, a thermoplastic resin film having copper foil bonded to one side thereof is used as a base material. The second line 14A is formed on the plastic resin film serving as the third insulating film 23, by etching the copper foil of the base material. Holes for respectively receiving the source electrode S and the gate electrode G of the first switching element Tr1 are formed in the plastic resin film serving as the third insulating film 23. Further, a plurality of via holes including via holes for respectively forming the second via 32, the third via 33 and a portion of the seventh via 37 are formed in the plastic resin film serving as the third insulating film 23. The metal paste 60 is filled into each of the via holes. Thus, the fourth sheet member S4 is produced.

The fifth sheet member 85 is produced for forming the fourth insulating film 24. In the fifth sheet member 85, a plastic resin film is used as a base material. A plurality of via holes including via holes for respectively forming the fourth via 34 and a portion of the eighth via 38 are formed in this base material. The metal paste 60 is filled into each of the vias. Thus, the fifth sheet member 55 is produced.

The sixth sheet member 86 is produced for forming the fifth insulating film 25. In the sixth sheet member S6, a plastic resin film is used as a base material. The component hole 25a for receiving the second switching element Tr2 is formed in this base material. A plurality of via holes including a via hole for forming a portion of the eighth via 38 are formed in this base material. The metal paste 60 is filled into each of the via holes. Thus, the sixth sheet member S6 is produced.

The seventh sheet member S7 is produced for forming the sixth insulating film 26 and the third line 16A. In the seventh sheet member S7; a thermoplastic resin film having copper foil bonded to one side thereof is used as a base material. The third line 16A is formed on the plastic resin film serving as the sixth insulating film 26, by etching the copper foil of the base material. Holes for respectively receiving the source electrode S and the gate electrode G of the second switching element Tr2 are formed in the plastic resin film serving as the sixth insulating film 26. Further, a plurality of via holes including via holes for respectively forming the fifth via 35, the sixth via 36 and a portion of the eighth via 38 are formed in the plastic resin film serving as the sixth insulating film 26. The metal paste 60 is filled into each of the via holes. Thus, the seventh sheet member S7 is produced.

The eighth sheet member S8 is produced for forming the upper insulating film 17. In the eighth sheet member 58, a plastic resin film is used as a base material. A plurality of terminal forming holes including terminal forming holes for respectively forming the first power supply terminal 41, the first gate terminal 42, the second power supply terminal 43, the second gate terminal 44 and the output terminal 45 are formed in this base material. The metal paste 60 is filled into each of the terminal forming holes. Thus, the eighth sheet member 58 is produced.

Next, the first to third sheet members S1 to S3 are stacked. The first switching element Tr1 is received in the component hole 22a of the third sheet member S3.

Thereafter, the fourth to sixth sheet members S4 to S6 are stacked thereon. The second switching element Tr2 is received in the component hole 25a of the sixth sheet member 56. Thereafter, the seventh and eighth sheet members S7, S8 are stacked thereon. Finally, hot pressing is performed on the stacked body.

Thus, the metal paste 60 is sintered. Thus, each of the vias 31 to 38 and the like, and each of the terminals 41 to 45 are formed, and electrical bonding between the sheet members and electrical bonding between the electrodes of switching elements Tr1, Tr2 and the vias are performed. The thermoplastic resin (insulating resin) is filled into gaps due to the flow of the thermoplastic resin, and the switching elements Tr1, Tr2 are sealed with the resin. Thus, the insulating resin 14B is filled into each gap between the second lines 14A, and the insulating resin 16B is filled into each gap between the third lines 16A. In this manner, the power module shown in FIGS. 1 to 3 is obtained.

In the above embodiment, the first via 31 and the second via 32 are connected to the drain electrode D on the lower surface of the first switching element Tr1 and the source electrode S on the upper surface thereof, respectively. The contact areas of the vies 31, 32, which contact the corresponding electrodes D, S, are equal to or larger than 50% of the areas of the surfaces of the first switching element Tr1 on which the corresponding electrodes D, S are formed, respectively (in other words, the contact area of the via 31, which contacts the electrode D, is equal to or larger than 50% of the area of the surface of the first switching element Tr1 on which the electrode D is formed, and the contact area of the via 32, which contacts the electrode S, is equal to or larger than 50% of the area of the surface of the first switching element Tr1 on which the electrode S is formed). The fourth via 34 and the fifth via 35 are connected to the drain electrode D on the lower surface of the second switching element Tr2 and the source electrode S on the upper surface thereof; respectively. The contact areas of the vias 34, 35, which contact the corresponding electrodes D, S, are equal to or larger than 50% of the areas of the surfaces of the second switching element Tr2 on which the corresponding electrodes D, S are formed, respectively (in other words, the contact area of the via 34, which contacts the electrode D, is equal to or larger than 50% of the area of the surface of the second switching element Tr2 on which the electrode D is formed, and the contact area of the via 35, which contacts the electrode S, is equal to or larger than 50% of the area of the surface of the switching element Tr2 on which the electrode S is formed). Therefore, when the power module 1 is manufactured, it is possible to reduce stress applied to each of the switching elements Tr1, Tr2. Thus, in a manufacturing process, it is possible to suppress or prevent occurrence of breakage in the power module 1.

Although the embodiment of the invention has been described, the invention may be implemented in other forms. For example, in the aforementioned embodiment, each of the switching elements Tr1, Tr2 is constituted by a MOSFET. However, each of the switching elements Tr1, Tr2 may be another semiconductor element. For example, each of the switching elements Tr1, Tr2 may be an Insulated Gate Bipolar Transistor (IGBT). In this case, the collector electrode and the emitter electrode of the IGBT serve as main electrodes, and the gate electrode of the IGBT serves as a control electrode.

Further, various design modifications may be made within the scope of the invention.

What is claimed is:

1. A semiconductor device comprising:
    a first line layer having a first line;
    a first interlayer film formed on the first line layer;
    a second line layer that is formed on the first interlayer film, and that has a second line;
    a first semiconductor element provided inside the first interlayer film, wherein the first interlayer film includes an insulating film and thickness of the insulating film in the first interlayer film in a stacking direction is equal to a thickness of the first semiconductor element;
    a second interlayer film formed on the second line layer;
    a second semiconductor element that is provided inside the second interlayer film, and that is disposed to face the first semiconductor element, wherein the second interlayer film includes an insulating film and a thickness of the insulating film in the second interlayer film in stacking direction is equal to a thickness of the second semiconductor element;
    a third line layer that is formed on the second interlayer film, and that has a third line;
    a first connection metal member that electrically connects the first line to a main electrode formed on a lower surface of the first semiconductor element;
    a second connection metal member that electrically connects the second line to a main electrode formed on an upper surface of the first semiconductor element;
    a third connection metal member that electrically connects the second line to a main electrode formed on a lower surface of the second semiconductor element;
    a fourth connection metal member that electrically connects the third line to a main electrode formed on an upper surface of the second semiconductor element; and
    a fifth connection metal member that is disposed at a region located outside regions of the first and second semiconductor elements in a plan view, the fifth connection metal member connecting the first line to the second line or connecting the second line to the third line,
    wherein a cross-sectional area of each of the first connection metal member, the second connection metal member, the third connection metal member and the fourth connection metal member is larger than a cross-sectional area of the fifth connection metal member.

2. The semiconductor device according to claim 1, wherein the semiconductor device is manufactured by stacking a plurality of sheet members on which predetermined processing is performed in advance, in a manner such that the first and second semiconductor elements are provided inside the sheet members, and hot-pressing the sheet members together.

3. The semiconductor device according to claim 1, further comprising:
    a lower insulating film on which the first line layer is formed,
    wherein the lower insulating film, the first interlayer film and the second interlayer film respectively include thermoplastic resin films as base materials, and
    wherein the first line layer, the second line layer and the third line layer are respectively formed on the thermoplastic resin films.

4. A semiconductor device comprising:
    a first line layer having a first line;
    a first interlayer film formed on the first line layer;
    a second line layer that is formed on the first interlayer film, and that has a second line;
    a first semiconductor element provided inside the first interlayer film;
    a second interlayer film formed on the second line layer;
    a second semiconductor element that is provided inside the second interlayer film, and that is disposed to face the first semiconductor element;
    a third line layer that is formed on the second interlayer film, and that has a third line;
    a first connection metal member that electrically connects the first line to a main electrode formed on a lower surface of the first semiconductor element;
    a second connection metal member that electrically connects the second line to a main electrode formed on an upper surface of the first semiconductor element;
    a third connection metal member that electrically connects the second line to a main electrode formed on a lower surface of the second semiconductor element; and
    a fourth connection metal member that electrically connects the third line to a main electrode formed on an upper surface of the second semiconductor element,
    wherein a contact area of the first connection metal member, which contacts the main electrode, is equal to or larger than 50% of an area of the lower surface of the first semiconductor element, a contact area of the second connection metal member, which contacts the main electrode, is equal to or larger than 50% of an area of the upper surface of the first semiconductor element, a contact area of the third connection metal member, which contacts the main electrode, is equal to or larger than 50% of an area of the lower surface of the second semiconductor element, and a contact area of the fourth connection metal member, which contacts the main electrode, is equal to or larger than 50% of an area of the upper surface of the second semiconductor element.

5. The semiconductor device according to claim 4, wherein the semiconductor device is manufactured by stacking a plurality of sheet members on which predetermined processing is performed in advance, in a manner such that the first and second semiconductor elements are provided inside the sheet members, and hot-pressing the sheet members together.

6. The semiconductor device according to claim 4, further comprising:
    a lower insulating film on which the first line layer is formed,
    wherein the lower insulating film, the first interlayer film and the second interlayer film respectively include thermoplastic resin films as base materials, and
    wherein the first line layer, the second line layer and the third line layer are respectively formed on the thermoplastic resin films.

* * * * *